US009941434B2

(12) United States Patent
Nakagawa et al.

(10) Patent No.: US 9,941,434 B2
(45) Date of Patent: Apr. 10, 2018

(54) PHOTOELECTRIC CONVERSION DEVICE, SOLAR CELL AND METHOD FOR MANUFACTURING PHOTOELECTRIC CONVERSION DEVICE

(71) Applicant: Kabushiki Kaisha Toshiba, Minato-ku (JP)

(72) Inventors: Naoyuki Nakagawa, Setagaya (JP); Soichiro Shibasaki, Nerima (JP); Hiroki Hiraga, Kawasaki (JP); Hitomi Saito, Kawaguchi (JP); Mutsuki Yamazaki, Yokohama (JP); Kazushige Yamamoto, Yokohama (JP); Shinya Sakurada, Shinagawa (JP); Michihiko Inaba, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/854,431

(22) Filed: Sep. 15, 2015

(65) Prior Publication Data
US 2016/0087127 A1 Mar. 24, 2016

(30) Foreign Application Priority Data
Sep. 22, 2014 (JP) .................................. 2014-192968

(51) Int. Cl.
| | | |
|---|---|---|
| H01L 31/0392 | (2006.01) | |
| H01L 31/0224 | (2006.01) | |
| H01L 31/032 | (2006.01) | |
| H01L 31/0376 | (2006.01) | |
| H01L 31/0749 | (2012.01) | |
| H01L 31/18 | (2006.01) | |

(52) U.S. Cl.
CPC .. *H01L 31/0392* (2013.01); *H01L 31/022425* (2013.01); *H01L 31/0322* (2013.01);
(Continued)

(58) Field of Classification Search
CPC ...... Y02P 70/521; Y02E 10/541; Y02E 10/50; H01L 31/022425; H01L 31/02568;
(Continued)

(56) References Cited

U.S. PATENT DOCUMENTS

| | | | |
|---|---|---|---|
| 2012/0222742 A1 | 9/2012 | Nakagawa et al. | |
| 2013/0233382 A1* | 9/2013 | Kobayashi ...... | H01L 31/022425 136/256 |

(Continued)

FOREIGN PATENT DOCUMENTS

| | | |
|---|---|---|
| CN | 103201846 A | 7/2013 |
| EP | 2 637 214 A1 | 9/2013 |

(Continued)

OTHER PUBLICATIONS

Extended European Search Report dated Feb. 17, 2016 in European Application No. 15185427.0.

(Continued)

*Primary Examiner* — Mayla Gonzalez Ramos
(74) *Attorney, Agent, or Firm* — Oblon, McClelland, Maier & Neustadt, L.L.P.

(57) ABSTRACT

A photoelectric conversion device of an embodiment has a substrate, a bottom electrode comprising an electrode layer on the substrate and an intermediate interface layer, a light absorbing layer on the intermediate interface layer. The electrode layer comprises Mo or W. The intermediate interface layer is a compound thin film of a compound comprising Mo or W and at least one element X selected from the group consisting of S, Se, and Te. The intermediate interface layer has a crystal phase and an amorphous phase with which the crystal phase is covered.

16 Claims, 3 Drawing Sheets

(52) U.S. Cl.
CPC ...... *H01L 31/0324* (2013.01); *H01L 31/0326* (2013.01); *H01L 31/0376* (2013.01); *H01L 31/03923* (2013.01); *H01L 31/03928* (2013.01); *H01L 31/0749* (2013.01); *H01L 31/1864* (2013.01); *Y02E 10/541* (2013.01); *Y02P 70/521* (2015.11)

(58) Field of Classification Search
CPC ............. H01L 31/0322; H01L 31/0326; H01L 31/03923; H01L 31/03928; H01L 31/0749; H01L 31/18; H01L 31/0324; H01L 31/0376; H01L 31/1864; H01L 31/0392

See application file for complete search history.

(56) References Cited

U.S. PATENT DOCUMENTS

| | | | |
|---|---|---|---|
| 2013/0299829 A1* | 11/2013 | Ishikawa | H01L 31/022425 257/53 |
| 2014/0224317 A1* | 8/2014 | Feist | H01L 23/291 136/256 |

FOREIGN PATENT DOCUMENTS

| | | |
|---|---|---|
| JP | 2011-198883 | 10/2011 |
| JP | 2012-033730 | 2/2012 |
| JP | 2012-099646 | 5/2012 |
| JP | 2012-114414 | 6/2012 |
| JP | 2013-062449 | 4/2013 |
| JP | 2013-118397 | 6/2013 |
| WO | 2012/086703 | 6/2012 |

OTHER PUBLICATIONS

Takahiro Wada, et al., "Chemical and Structural Characterization of Cu(In, Ga)Se$_2$/Mo Interface in Cu(In, Ga)Se$_2$ Solar Cells", Jpn. J. Appl. Phys. vol. 35 (1996) pp. L1253-L1256, Part 2, No. 10A, 1996.

* cited by examiner

PHOTOELECTRIC CONVERSION DEVICE, SOLAR CELL AND METHOD FOR MANUFACTURING PHOTOELECTRIC CONVERSION DEVICE

CROSS-REFERENCE TO RELATED APPLICATION

This application is based upon and claims the benefit of priority from Japanese Patent Application No. 2014-192968 filed on Sep. 22, 2014; the entire contents of which are incorporated herein by reference.

FIELD

Embodiments described herein relate to a photoelectric conversion device, a solar cell, a method for manufacturing a photoelectric conversion device, and a method for manufacturing a solar cell.

BACKGROUND

Compound photoelectric conversion devices having a semiconductor thin film as a light absorbing layer have been developed. In particular, photoelectric conversion devices having, as a light absorbing layer, a p-type semiconductor layer with a chalcopyrite structure have high conversion efficiency and thus promising applications. Specifically, photoelectric conversion devices having a light absorbing layer of $Cu(In,Ga)Se_2$ as a Cu—In—Ga—Se (CIGS) compound have relatively high conversion efficiency.

A photoelectric conversion device has a p-type Cu—In—Ga—Se semiconductor layer as a light absorbing layer. Such a photoelectric conversion device generally has a structure including a soda-lime glass substrate, and a Mo electrode layer, a p-type semiconductor layer, an n-type semiconductor layer, an insulating layer, a transparent electrode, a top electrode, and an antireflective film, which are stacked on the substrate. Such a high-efficiency CIGS photoelectric conversion device is designed to have a homojunction structure in which the p-type semiconductor layer has an n-doped part in the vicinity of the upper transparent electrode. The n-doping is performed by a treatment in a solution after the p-type semiconductor layer is formed by vapor deposition or the like. In the solution treatment, peeling can easily occur at the interface between the p-type semiconductor layer and the Mo electrode layer. It is known that when a CIGS light absorbing layer is deposited on a Mo electrode layer, a c-axis-oriented $MoSe_2$ layer is formed at the interface between them. The $MoSe_2$ layer can easily undergo delamination because of its weak van der Waals interlayer coupling. It is known that a randomly-oriented $MoSe_2$ layer is formed so that it can have improved adhesion.

DETAILED DESCRIPTION

A photoelectric conversion device of an embodiment has a substrate, a bottom electrode comprising an electrode layer on the substrate and an intermediate interface layer, a light absorbing layer on the intermediate interface layer. The electrode layer comprises Mo or W. The intermediate interface layer is a compound thin film of a compound comprising Mo or W and at least one element X selected from the group consisting of S, Se, and Te. The intermediate interface layer has a crystal phase and an amorphous phase with which the crystal phase is covered.

A solar cell of an embodiment has a photoelectric conversion device. The photoelectric conversion device has a substrate, a bottom electrode comprising an electrode layer on the substrate and an intermediate interface layer, a light absorbing layer on the intermediate interface layer. The electrode layer comprises Mo or W. The intermediate interface layer is a compound thin film of a compound comprising Mo or W and at least one element X selected from the group consisting of S, Se, and Te. The intermediate interface layer has a crystal phase and an amorphous phase with which the crystal phase is covered.

A method for manufacturing a photoelectric conversion device of an embodiment has forming an electrode layer on a substrate, heat-treating the electrode layer at 500° C. to 600° C. in an atmosphere containing at least one element X selected from the group consisting of S, Se, and Te, forming a compound semiconductor layer on the heat-treated substrate.

A method for manufacturing a solar cell of an embodiment has forming an electrode layer on a substrate, heat-treating the electrode layer at 500° C. to 600° C. in an atmosphere containing at least one element X selected from the group consisting of S, Se, and Te, forming a compound semiconductor layer on the heat-treated substrate.

Hereinafter, embodiments will be described in detail with reference to the drawings.

(Photoelectric Conversion Device)

Figure 1:
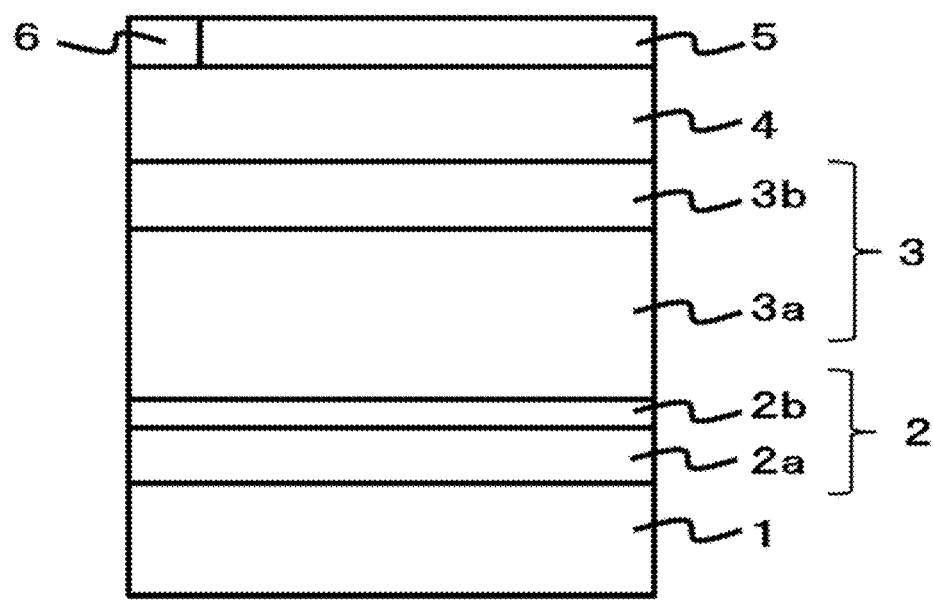
FIG. 1 is a schematic cross-sectional view of a photoelectric conversion device according to an embodiment.
Figure 2:
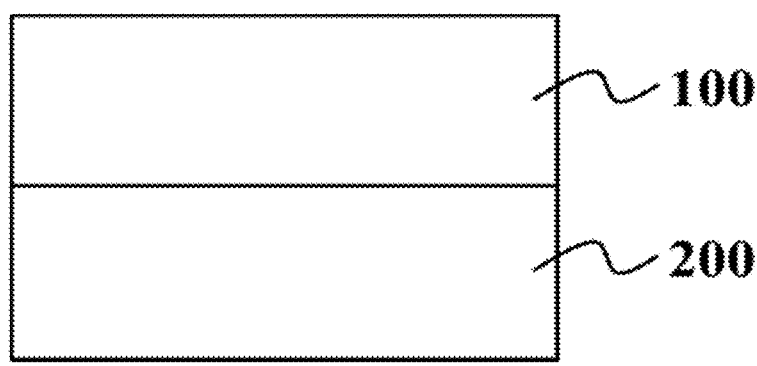
FIG. 2 is a schematic cross-sectional view of a multi-junction photoelectric conversion device according to an embodiment.

FIG. 1 is a schematic cross-sectional view of a photoelectric conversion device 100 according to an embodiment. The photoelectric conversion device 100 includes a substrate 1; a bottom electrode 2 including an electrode layer 2a formed on the substrate 1 and an intermediate interface layer 2b; a light absorbing layer 3 including a p-type semiconductor layer 3a formed on the bottom electrode 2 and an n-type semiconductor layer 3b joined to the p-type semiconductor layer 3a; a transparent electrode 4 formed on the light absorbing layer 3; a top electrode 5 formed on the transparent electrode 4; and an antireflective film 6 formed on the top electrode 5. The light absorbing layer 3 has the p-type semiconductor layer 3a on its bottom electrode 2 side and has the n-type semiconductor layer 3b on its top electrode 4 side. Specifically, the photoelectric conversion device 100 may be a solar cell. As shown in FIG. 2, which is a schematic cross-sectional view of a multi-junction photoelectric conversion device, the photoelectric conversion device 100 of an embodiment may be joined to another photoelectric conversion device 200 to form a multi-junction device. The light absorbing layer of the photoelectric conversion device 100 preferably has a band gap wider than that of the light absorbing layer of the photoelectric conversion device 200. For example, Si is used to form the light absorbing layer of the photoelectric conversion device 200. A method for manufacturing the photoelectric conversion device of an embodiment preferably includes forming the electrode layer 2a on the substrate 1; heat-treating the electrode layer 2a at 500° C. to 600° C. in an atmosphere containing at least one element X selected from the group consisting of S, Se, and Te; and forming the compound semiconductor layer 3a on the heat-treated substrate. To form a solar cell of an embodiment, it is preferable to manufacture the photoelectric conversion device by this manufacturing method.

(Substrate)

In an embodiment, the substrate 1 is preferably made of Na-containing glass such as soda-lime glass, and alternatively, the substrate 1 may be made of white glass, a sheet of a metal such as stainless steel, Ti, or Cr, or a resin such as polyimide. An appropriate substrate may be selected depending on the temperature of the heat treatment in the process of forming the intermediate interface layer 2b.

(Bottom Electrode)

In an embodiment, the bottom electrode 2 as an electrode of the photoelectric conversion device 100 includes an electrode layer 2a and an intermediate interface layer 2b, in which the electrode layer 2a is electrically conductive and formed on the substrate 1. The electrode layer 2a may be a conductive metal film including Mo, W, or the like or a transparent conductive film including indium tin oxide (ITO). When the electrode layer 2a is a metal film, it is preferably a Mo film or a W film. When the electrode layer 2a is a transparent electrode film, the electrode layer 2a should further include a 5 nm to 20 nm-thick, Mo- or W-containing metal film or Mo or W film, which is disposed between the transparent electrode film and the intermediate interface layer 2b.

The transparent electrode may be a multilayer film including an ITO layer and one or both of $SnO_2$ and $TiO_2$ thin films deposited on the light absorbing layer 3 side of the ITO layer. To prevent the diffusion of impurities from the substrate 1, an extremely thin film of $SiO_2$ is preferably placed between the ITO and the substrate 1. Examples of the multilayer structure of the electrode layer 2a include $SnO_2$/ITO/$SiO_2$, $SnO_2$/$TiO_2$/ITO/$SiO_2$, $TiO_2$/$SnO_2$/ITO/$SiO_2$, and $TiO_2$/ITO/$SiO_2$.

When the electrode layer 2a is a film of a metal such as Mo or W, the thickness of the electrode layer 2a is preferably, for example, 100 nm to 1,000 nm. When the electrode layer 2a has a multilayer structure, the total thickness of all the layers is preferably 100 nm to 1,000 nm. For example, the thickness of each layer is preferably 10 nm to 100 nm for $SnO_2$, 10 nm to 100 nm for $TiO_2$, 100 nm to 500 nm for ITO, and 5 nm to 20 nm for $SiO_2$.

The intermediate interface layer 2b may be a compound thin film of a compound composed of a transition metal such as Mo or W and at least one element X selected from the group consisting of S, Se, and Te. In particular, a compound thin film of a compound composed of Mo and Se is preferably used to form the intermediate interface layer 2b. In view of peeling resistance, the element X preferably includes at least the same group VIb element as contained in the p-type light absorbing layer 3a. The intermediate interface layer 2b preferably has a thickness of 5 nm to 100 nm, more preferably 5 nm to 20 nm for the conductivity of the bottom electrode 2.

Figure 3:
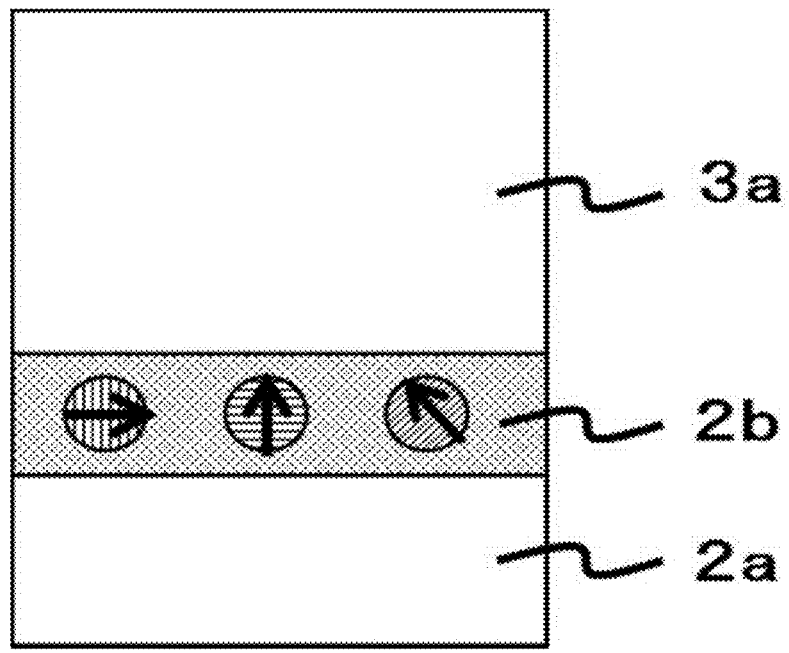
FIG. 3 is a partially-enlarged schematic cross-sectional view of a photoelectric conversion device according to an embodiment.

As shown in FIG. 3, which is a partial enlarged schematic cross-sectional view of the photoelectric conversion device 100, the intermediate interface layer 2b preferably includes a crystal phase and an amorphous phase with which the crystal phase is covered. The crystal phase covered with the amorphous phase is preferred in view of bonding strength. If the ratio of the crystal phase to the amorphous phase is too high, the crystal phase can be insufficiently covered with the amorphous phase, which is not preferred. Therefore, the ratio Sc/(Sa+Sc) (cross-sectional area ratio) preferably satisfies Sc/(Sa+Sc)≤0.9, wherein Sc is the area of the crystal phase, and Sa is the area of the amorphous phase. When the ratio falls within this range, the amorphous phase can relax the lattice mismatch between the light absorbing layer 3 and the electrode layer 2a to further improve the peeling resistance. Too high an amorphous phase content is not preferred because it can reduce the electrical conductivity of the intermediate interface layer 2b, although it is preferred for peeling resistance. Therefore, in view of peeling resistance and electrical conductivity, the ratio Sc/(Sa+Sc) (cross-sectional area ratio) more preferably satisfies 0.4≤Sc/(Sa+Sc)≤0.9, wherein Sc is the area of the crystal phase, and Sa is the area of the amorphous phase. For the above reason, 80% or more (number ratio) of the crystal phase in the intermediate interface layer 2b is preferably covered with the amorphous phase.

The crystals in the crystal phase of the intermediate interface layer 2b are preferably not completely aligned in view of the peeling resistance. Preferably, the crystals in the crystal phase of the intermediate interface layer 2b are randomly oriented. The random orientation of crystals in the crystal phase means that crystals with c-axes oriented in the same direction (the values in radian units are identical in two significant digits) make up 10% or less of the crystals in the crystal phase of the intermediate interface layer 2b.

The microstructure of the intermediate interface layer 2b can be determined from a cross-sectional transmission electron microscope (TEM) image of the photoelectric conversion device. The intermediate interface layer 2b should be observed at a magnification of 2,000,000 times. Whether part of the intermediate interface layer is amorphous can also be determined by electron beam diffraction. A spot diffraction pattern is obtained when the layer is crystallized, and a ring diffraction pattern is obtained when the layer is amorphous. This makes it possible to determine the crystallinity of the layer. The area ratio between the crystal and amorphous phases in the intermediate interface layer 2b is determined as follows. A cross-sectional TEM image of the central part of the photoelectric conversion device 100 is divided into 10 regions in the widthwise direction of the cross-section. The areas of the crystal and amorphous phases in the intermediate interface layer 2b are calculated using a 100-nm square image observed at the center of each divided region. Ten ratios are calculated, and the average ratio is calculated from the data in which the maximum and minimum values are excluded. The ratio of the crystal phase interface covered with the amorphous phase is also determined based on a method of differentiating between the crystal and amorphous phases. The interface between the intermediate interface layer 2b and the electrode layer 2a is defined as the crystal interface between the electrode layer 2a and the amorphous phase linearly extending in the cross-sectional image. The interface between the p-type compound semiconductor layer 3a and the intermediate interface layer 2b is defined as the crystal interface between the p-type compound semiconductor layer 3a and the amorphous phase linearly extending in the cross-sectional image.

The direction of the orientation of crystals in the crystal phase of the intermediate interface layer $2b$ is determined by observing the crystal phase in a 100-nm square area at the center of each of the 10 divided regions of the cross-sectional image. In the photoelectric conversion device, for example, a $MoSe_2$ layer may be formed on the Mo electrode layer to form an ohmic contact between the Mo electrode layer and a CIGS light absorbing layer.

The intermediate interface layer $2b$ can be formed by heat-treating the surface of the Mo- or W-containing metal film of the electrode layer $2a$ at a high temperature of 500° C. or more in an atmosphere containing the element X. If the temperature is lower than 500° C., the reaction between the Mo thin film and Se for the intermediate interface layer $2b$ will be insufficient, which will make it difficult to form a compound thin film of a compound of Mo and Se or will reduce the content of the amorphous phase in the finally formed intermediate interface layer $2b$. On the other hand, if the heat treatment temperature is too high, the finally formed intermediate interface layer $2b$ will have too high an amorphous phase content, which will reduce the electrical conductivity of the intermediate interface layer $2b$ and is therefore not preferred. Temperatures higher than 600° C. can cause distortion of a soda-lime glass substrate and are therefore not preferred. For these reasons, the high-temperature heat treatment in the element X atmosphere is preferably performed at 500° C. to 600° C. In order to increase the content of the amorphous phase in the finally formed intermediate interface layer $2b$, the high-temperature heat treatment in the element X atmosphere is preferably performed at 550° C. to 600° C. In the process of directly depositing the light absorbing layer $3$ on the bottom electrode $2$ by vapor deposition or sputtering, the surface of at least part of the electrode layer $2a$ can be modified to form the intermediate interface layer $2b$ between the electrode layer $2a$ and the light absorbing layer $3$.

(Light Absorbing Layer)

In an embodiment, the light absorbing layer $3$ is a photoelectric conversion layer of the photoelectric conversion device $100$. The light absorbing layer $3$ is also a semiconductor layer including p-type and n-type compound semiconductor layers $3a$ and $3b$ with a homojunction or a heterojunction therebetween. The light absorbing layer $3$ may include a layer of a compound semiconductor including a group Ib element or elements, a group IIIb element or elements, and a group VIb element or elements and having any one of chalcopyrite, stannite, and kesterite structures, such as CIGS ($Cu(In,Ga)Se_2$), CIGSS ($Cu(In,Ga)(Se,S)_2$), CGS ($CuGaSe_2$), AGS ($CuGaSe_2$), CAGS (($Cu,Ag)GaSe_2$), AGSS ($CuGa(Se,S)_2$), or AIGS ($Ag(In,Ga)Se_2$). The group Ib element or elements preferably include at least Cu or Ag. The group IIIb element or elements preferably include at least one element selected from the group consisting of Al, In, and Ga, more preferably include In or Ga. The group VIb element or elements preferably include at least one element selected from the group consisting of O, S, Se, and Te, more preferably include Se or S. Among the group IIIb elements, In is more preferred because the band gap can be easily set to a desired level by using In in combination with Ga.

Specifically, the light absorbing layer $3$ may include a compound semiconductor such as $Cu(In,Ga)(S,Se)_2$, $Cu(In,Ga)(Se,Te)_2$, $Cu(In,Ga)_3(Se,Te)_5$, $Cu(Al,Ga,In)Se_2$, $Cu_2ZnSnS_4$, or $Ag(In,Ga)(S,Se)_2$, more specifically, $Cu(In,Ga)Se_e$, $CuInSe_2$, $CuInTe_2$, $CuGaSe_2$, $CuIn_3Te_5$, or $Ag(In,Ga)(S,Se)_2$.

In an embodiment, the light absorbing layer $3$, when it is of a homojunction type, includes the p-type compound semiconductor on the electrode layer $2a$ side and the n-type compound semiconductor on the transparent electrode $4$ side. The light absorbing layer $3$ typically has a thickness of 1,000 nm to 3,000 nm. The p-type region $3a$ preferably has a thickness of, for example, 1,500 nm to 2,500 nm, and the n-type region $3b$ preferably has a thickness of, for example, 50 nm to 500 nm. The n-type compound semiconductor layer $3b$ of a heterojunction type may include, for example, CdS, $ZnO_{1-x}S_x$, or the like.

Next, it will be described how to produce the light absorbing layer $3$ according to an embodiment.

In an embodiment, the light absorbing layer $3$ is obtained by a process that includes forming a p-type semiconductor layer as a precursor on the bottom electrode $2$ and converting a region of the p-type semiconductor layer to an n-type layer, wherein the region is on the side where the transparent electrode $4$ is to be formed. The method of forming the p-type semiconductor layer may be a thin-film forming method such as a vapor deposition method (three-stage method) including a rapid cooling step between its second and third stages, or a sputtering method. In an embodiment, the three-stage method includes depositing Ga or In and Se or S on the electrode layer $2a$, then depositing Cu and Se at a high temperature, then rapidly cooling the product, and depositing Ga or In and Se or S again at a low temperature to form the light absorbing layer $3$. A vapor deposition method will be described below as the production method. Alternatively, a sputtering method may be used to form the light absorbing layer $3$ according to an embodiment. In this case, for example, the method may include forming a film, under low-temperature conditions, at the region to be in the vicinity of the transparent electrode $4$.

In the vapor deposition method (three-stage method), first, the substrate (a member composed of the substrate $1$ and the bottom electrode $2$ formed thereon) is heated to a temperature of 200° C. to 400° C., and a group IIIb element such as In or Ga and a group VIb element such as Se are deposited thereon (first stage).

Subsequently, the substrate is heated to a temperature of 450° C. to 550° C., and Cu (a group Ib element) and a group VIb element such as Se are deposited. The start of an endothermic reaction is checked, and the deposition of the group Ib element Cu is stopped once when the composition has an excess of the group Ib element Cu (second stage).

Immediately after the deposition is stopped, the substrate is rapidly cooled by natural cooling or by locally spraying an inert gas such as nitrogen or argon, so that the substrate is cooled to a temperature of 400° C. or lower. After the rapid cooling, a group IIIb element such as In or Ga and a group VIb element such as Se are deposited again (third stage) to form a composition with a slight excess of a group IIIb element such as In or Ga.

The bottom electrode $2$-side part of the light absorbing layer $3$ has large crystal grain sizes because it is formed at a high temperature. On the other hand, the rapid cooling after the completion of the second-stage deposition allows the transparent electrode $4$-side part of the light absorbing layer $3$ to have small grain sizes or to be amorphous. In addition, the rapid cooling followed by the third-stage deposition at a low temperature can suppress the diffusion of the group Ib element Cu, so that the transparent electrode $4$-side part of the light absorbing layer $3$ can contain many Cu vacancies as compared with when the rapid cooling is not performed. When n-type doping is performed on the product with many Cu vacancies, a large amount of the n-type dopant can enter the Cu vacancy sites, which is advantageous in that the doped region can function as an n-typedopant-rich n-type semiconductor. After the p-type semiconductor layer is formed, part of the p-type semiconductor layer can be converted from the p-type to the n-type by liquid-phase doping with a solution containing an n-type dopant such as Cd or Zn (e.g., cadmium sulfate). When part of the p-type semiconductor layer is converted to the n-type, a homojunction-type light absorbing layer 3 is formed, which has a homojunction between the p-type layer 3a and the n-type layer 3b. The doping process may be performed in such a manner that the concentration of the n-dopant is higher on the side where the transparent electrode 4 is to be formed. The doping with the n-dopant is preferably followed by washing off the dopant with water before the next step is performed.

(Transparent Electrode)

In an embodiment, the transparent electrode 4 is a film electrically conductive and transparent for light such as sunlight. For example, the transparent electrode 4 may include ZnO:Al containing 2 wt % of alumina ($Al_2O_3$) or include ZnO:B containing B as a dopant derived from diborane. A semi-insulating layer, such as an i-ZnO layer, for serving as a protective layer may also be formed, for example, with a thickness of about 20 nm to about 100 nm between the transparent electrode 4 and the light absorbing layer 3. The transparent electrode 4 can be formed by sputtering or other deposition techniques.

(Top Electrode)

In an embodiment, the top electrode 5 as an electrode of the photoelectric conversion device is a metal film formed on the transparent electrode 4. The top electrode 5 may include Al, Ag, Au, or the like. Al, Ag, Au, or the like may be deposited on a Ni or Cr film formed on the transparent electrode 4 by deposition so that the adhesion of the top electrode to the transparent electrode 4 can be increased. The top electrode 5 typically has a thickness of 300 nm to 1,000 nm. For example, the top electrode 5 can be deposited by resistance heating vapor deposition. In an embodiment, the top electrode 5 may be omitted.

(Antireflective Film)

In an embodiment, the antireflective film 6 is a film provided to facilitate the introduction of light into the light absorbing layer 3. The antireflective film 6 is formed on the transparent electrode 4. For example, the antireflective film 6 preferably includes $MgF_2$. The antireflective film 6 typically has a thickness of 90 nm to 120 nm. For example, the antireflective film 6 can be formed by electron beam vapor deposition.

Hereinafter, the photoelectric conversion device of an embodiment will be more specifically described with reference to examples.

EXAMPLE 1

Soda-lime glass was used as the substrate 1, and a Mo thin film with a thickness of about 700 nm was deposited by sputtering to form the electrode layer 2a on the substrate 1. The sputtering was performed in an Ar gas atmosphere under application of 200 W RF using a Mo target. The Mo thin film deposited to form the electrode layer 2a was then heated to 600° C. in a Se atmosphere, so that the intermediate interface layer 2b was formed. A $CuIn_{0.7}Ga_{0.3}Se_2$ thin film for the light absorbing layer 3 was formed on the bottom electrode 2 by vapor deposition (three-stage method). First, the substrate was heated to a temperature of 300° C., and In, Ga, and Se were deposited thereon (first stage). Subsequently, the substrate was heated to a temperature of 500° C., and Cu and Se were deposited thereon. The start of an endothermic reaction was checked, and the deposition of Cu was stopped once when the composition had an excess of Cu (second stage). Immediately after the deposition was stopped, the substrate was rapidly cooled to a temperature of 400° C. by natural cooling. After the rapid cooling, In, Ga, and Se were deposited again (third stage) to form a composition with a slight excess of a group IIIb element such as In or Ga. The light absorbing layer 3 was formed with a thickness of about 2,500 nm, and the small grain size layer was formed with a thickness of about 200 nm.

The product obtained after the deposition of the light absorbing layer 3 was immersed in a 0.8 mM cadmium sulfate solution and allowed to react at 80° C. for 22 minutes so that part of the light absorbing layer 3 was converted to an n-type layer. Thus, an about 100-nm-thick, n-type semiconductor layer 3b doped with Cd was formed as a front-side part of the light absorbing layer 3. A semi-insulating layer of an i-ZnO thin film for serving as a protective film was deposited on the n-type semiconductor layer 3b by spin coating. Subsequently, ZnO:Al containing 2 wt % of alumina ($Al_2O_3$) for serving as the transparent electrode 4 was deposited with a thickness of about 1 µm on the protective film. Al was further deposited as the top electrode 5 by resistance heating. The Al thickness was about 300 nm. Finally, a $MgF_2$ film with a thickness of about 100 nm was deposited as the antireflective film 6 by electron beam vapor deposition. In this way, the photoelectric conversion device 100 of an embodiment was obtained.

Figure 4:
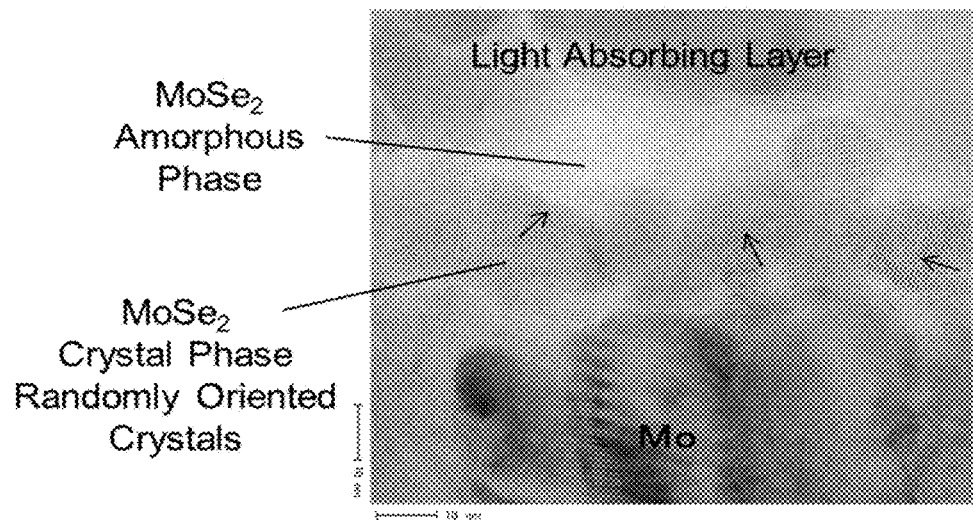
FIG. 4 is a cross-sectional TEM image of a region at and around an intermediate interface layer of a photoelectric conversion device of an example.
Figure 5:
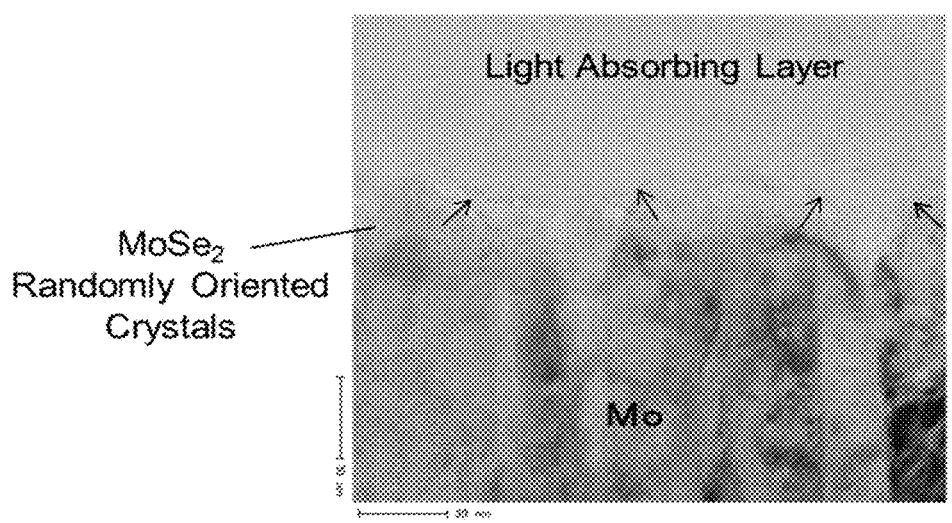
FIG. 5 is a cross-sectional TEM image of a region at and around an intermediate interface layer of a photoelectric conversion device of a comparative example.

The cross-sectional structure of the intermediate interface layer 2b of the resulting photoelectric conversion device 100 was observed with a TEM. FIG. 4 shows the cross-sectional TEM image of a region at and around the intermediate interface layer 2b of the photoelectric conversion device of Example 1. The intermediate interface layer 2b had a structure in which randomly-oriented $MoSe_2$ crystallites were covered with a $MoSe_2$ amorphous phase. The area ratio between the crystal and amorphous phases of the intermediate interface layer 2b was calculated from the cross-sectional TEM image by the method described above.

The peeling resistance was evaluated by the cross-cut test according to the JIS standard (JIS K 5600-5-6 (1999)). A small test piece with 25-square cross-cuts at intervals of 1 mm was evaluated for adhesion. As a result of the test, the peeling resistance of the piece was rated "A" when 90% to 100% of the squares remained adhering, "B" when less than 90% to 60% of the squares remained adhering, and "C" when less than 60% of the squares remained adhering. Tables 1 and 2 show the results of the examples and the comparative examples.

EXAMPLE 2

A photoelectric conversion device was prepared by the same process as in Example 1, except that the Mo thin film deposited to form the electrode layer 2a was heated at a temperature of 550° C. in the Se atmosphere. The calculation of the area ratio between the crystal and amorphous phases of the intermediate interface layer 2b and the evaluation of the adhesion by the cross-cut test were then performed as in Example 1.

EXAMPLE 3

A photoelectric conversion device was prepared by the same process as in Example 1, except that the Mo thin film deposited to form the electrode layer 2a was heated at a temperature of 500° C. in the Se atmosphere. The calculation of the area ratio between the crystal and amorphous phases of the intermediate interface layer 2b and the evaluation of the adhesion by the cross-cut test were then performed as in Example 1.

EXAMPLE 4

A photoelectric conversion device was prepared by the same process as in Example 1, except that CIGSS (CuIn$_{0.7}$Ga$_{0.3}$Se$_{0.9}$S$_{0.1}$) was used to form the light absorbing layer 3. The calculation of the area ratio between the crystal and amorphous phases of the intermediate interface layer 2b and the evaluation of the adhesion by the cross-cut test were then performed as in Example 1.

EXAMPLE 5

A photoelectric conversion device was prepared by the same process as in Example 2, except that CIGSS (CuIn$_{0.7}$Ga$_{0.3}$Se$_{0.9}$S$_{0.1}$) was used to form the light absorbing layer 3. The calculation of the area ratio between the crystal and amorphous phases of the intermediate interface layer 2b and the evaluation of the adhesion by the cross-cut test were then performed as in Example 1.

EXAMPLE 6

A photoelectric conversion device was prepared by the same process as in Example 3, except that CIGSS (CuIn$_{0.7}$Ga$_{0.3}$Se$_{0.9}$S$_{0.1}$) was used to form the light absorbing layer 3. The calculation of the area ratio between the crystal and amorphous phases of the intermediate interface layer 2b and the evaluation of the adhesion by the cross-cut test were then performed as in Example 1.

EXAMPLE 7

A photoelectric conversion device was prepared by the same process as in Example 1, except that CGS (CuGaSe$_2$) was used to form the light absorbing layer 3, SnO$_2$ (100 nm)/ITO (150 nm)/SiO$_2$ (10 nm) (S/I/S) was used to form the electrode layer 2a, and an about 10-nm-thick No thin film was further deposited thereon. The calculation of the area ratio between the crystal and amorphous phases of the intermediate interface layer 2b and the evaluation of the adhesion by the cross-cut test were then performed as in Example 1.

EXAMPLE 8

A photoelectric conversion device was prepared by the same process as in Example 2, except that CGS (CuGaSe$_2$) was used to form the light absorbing layer 3, SnO$_2$/ITO/SiO$_2$ (S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 9

A photoelectric conversion device was prepared by the same process as in Example 3, except that CGS (CuGaSe$_2$) was used to form the light absorbing layer 3, SnO$_2$/ITO/SiO$_2$ (S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 10

A photoelectric conversion device was prepared by the same process as in Example 1, except that CGS (CuGaSe$_2$) was used to form the light absorbing layer 3, TiO$_2$ (10 nm)/SnO$_2$ (100 nm)/ITO (150 nm)/SiO$_2$ (10 nm) (T/S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 11

A photoelectric conversion device was prepared by the same process as in Example 2, except that CGS (CuGaSe$_2$) was used to form the light absorbing layer 3, TiO$_2$/SnO$_2$/ITO/SiO$_2$ (T/S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 12

A photoelectric conversion device was prepared by the same process as in Example 3, except that CGS (CuGaSe$_2$) was used to form the light absorbing layer 3, TiO$_2$/SnO$_2$/ITO/SiO$_2$ (T/S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 13

A photoelectric conversion device was prepared by the same process as in Example 1, except that AGS (AgGaSe$_2$) was used to form the light absorbing layer 3, SnO$_2$/ITO/SiO$_2$ (S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 14

A photoelectric conversion device was prepared by the same process as in Example 2, except that AGS (AgGaSe$_2$) was used to form the light absorbing layer 3, SnO$_2$/ITO/SiO$_2$ (S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 15

A photoelectric conversion device was prepared by the same process as in Example 3, except that AGS (AgGaSe$_2$)

was used to form the light absorbing layer 3, $SnO_2/ITO/SiO_2$ (S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 16

A photoelectric conversion device was prepared by the same process as in Example 1, except that AGS ($AgGaSe_2$) was used to form the light absorbing layer 3, $TiO_2/SnO_2/ITO/SiO_2$ (T/S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 17

A photoelectric conversion device was prepared by the same process as in Example 2, except that AGS ($AgGaSe_2$) was used to form the light absorbing layer 3, $TiO_2/SnO_2/ITO/SiO_2$ (T/S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 18

A photoelectric conversion device was prepared by the same process as in Example 3, except that AGS ($AgGaSe_2$) was used to form the light absorbing layer 3, $TiO_2/SnO_2/ITO/SiO_2$ (T/S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 19

A photoelectric conversion device was prepared by the same process as in Example 1, except that CGSS ($CuGaSe_{0.58}S_{0.42}$) was used to form the light absorbing layer 3, $SnO_2/ITO/SiO_2$ (S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 20

A photoelectric conversion device was prepared by the same process as in Example 2, except that CGSS ($CuGaSe_{0.58}S_{0.42}$) was used to form the light absorbing layer 3, $SnO_2/ITO/SiO_2$ (S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 21

A photoelectric conversion device was prepared by the same process as in Example 3, except that CGSS ($CuGaSe_{0.58}S_{0.42}$) was used to form the light absorbing layer 3, $SnO_2/ITO/SiO_2$ (S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 22

A photoelectric conversion device was prepared by the same process as in Example 1, except that CGSS ($CuGaSe_{0.58}S_{0.42}$) was used to form the light absorbing layer 3, $TiO_2/SnO_2/ITO/SiO_2$ (T/S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 23

A photoelectric conversion device was prepared by the same process as in Example 2, except that CGSS ($CuGaSe_{0.58}S_{0.42}$) was used to form the light absorbing layer 3, $TiO_2/SnO_2/ITO/SiO_2$ (T/S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 24

A photoelectric conversion device was prepared by the same process as in Example 3, except that CGSS ($CuGaSe_{0.58}S_{0.42}$) was used to form the light absorbing layer 3, $TiO_2/SnO_2/ITO/SiO_2$ (T/S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 25

A photoelectric conversion device was prepared by the same process as in Example 1, except that AGSS ($AgGaSe_{0.82}S_{0.18}$) was used to form the light absorbing layer 3, $SnO_2/ITO/SiO_2$ (S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 26

A photoelectric conversion device was prepared by the same process as in Example 2, except that AGSS (AgGaSe$_{0.82}$S$_{0.18}$) was used to form the light absorbing layer 3, SnO$_2$/ITO/SiO$_2$ (S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 27

A photoelectric conversion device was prepared by the same process as in Example 3, except that AGSS (AgGaSe$_{0.82}$S$_{0.18}$) was used to form the light absorbing layer 3, SnO$_2$/ITO/SiO$_2$ (S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 28

A photoelectric conversion device was prepared by the same process as in Example 1, except that AGSS (AgGaSe$_{0.82}$S$_{0.18}$) was used to form the light absorbing layer 3, TiO$_2$/SnO$_2$/ITO/SiO$_2$ (T/S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 29

A photoelectric conversion device was prepared by the same process as in Example 2, except that AGSS (AgGaSe$_{0.82}$S$_{0.18}$) was used to form the light absorbing layer 3, TiO$_2$/SnO$_2$/ITO/SiO$_2$ (T/S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

EXAMPLE 30

A photoelectric conversion device was prepared by the same process as in Example 3, except that AGSS (AgGaSe$_{0.82}$S$_{0.18}$) was used to form the light absorbing layer 3, TiO$_2$/SnO$_2$/ITO/SiO$_2$ (T/S/I/S) was used to form the electrode layer 2a, and an about 10-nm-thick Mo thin film was further deposited thereon. The calculation of the area ratio between the crystal and amorphous phases of the intermediate interface layer 2b and the evaluation of the adhesion by the cross-cut test were then performed as in Example 1.

Comparative Examples 1 and 2

Photoelectric conversion devices were prepared by the same process as in Example 1, except that before the deposition of the light absorbing layer 3, the high-temperature heating in the Se atmosphere was not performed or the temperature of the heating in the Se atmosphere was 300° C. The calculation of the area ratio between the crystal and amorphous phases of the intermediate interface layer 2b and the evaluation of the adhesion by the cross-cut test were then performed as in Example 1.

Comparative Examples 3 and 4

Photoelectric conversion devices were prepared by the same process as in Example 4, except that before the deposition of the light absorbing layer 3, the high-temperature heating in the Se atmosphere was not performed or the temperature of the heating in the Se atmosphere was 300° C. The calculation of the area ratio between the crystal and amorphous phases of the intermediate interface layer 2b and the evaluation of the adhesion by the cross-cut test were then performed as in Example 1.

Comparative Examples 5 and 6

Photoelectric conversion devices were prepared by the same process as in Example 7, except that before the deposition of the light absorbing layer 3, the high-temperature heating in the Se atmosphere was not performed or the temperature of the heating in the Se atmosphere was 300° C. The calculation of the area ratio between the crystal and amorphous phases of the intermediate interface layer 2b and the evaluation of the adhesion by the cross-cut test were then performed as in Example 1.

Comparative Examples 7 and 8

Photoelectric conversion devices were prepared by the same process as in Example 10, except that before the deposition of the light absorbing layer 3, the high-temperature heating in the Se atmosphere was not performed or the temperature of the heating in the Se atmosphere was 300° C. The calculation of the area ratio between the crystal and amorphous phases of the intermediate interface layer 2b and the evaluation of the adhesion by the cross-cut test were then performed as in Example 1.

Comparative Examples 9 and 10

Photoelectric conversion devices were prepared by the same process as in Example 13, except that before the deposition of the light absorbing layer 3, the high-temperature heating in the Se atmosphere was not performed or the temperature of the heating in the Se atmosphere was 300° C. The calculation of the area ratio between the crystal and amorphous phases of the intermediate interface layer 2b and the evaluation of the adhesion by the cross-cut test were then performed as in Example 1.

Comparative Examples 11 and 12

Photoelectric conversion devices were prepared by the same process as in Example 16, except that before the deposition of the light absorbing layer 3, the high-temperature heating in the Se atmosphere was not performed or the temperature of the heating in the Se atmosphere was 300° C. The calculation of the area ratio between the crystal and amorphous phases of the intermediate interface layer 2b and the evaluation of the adhesion by the cross-cut test were then performed as in Example 1.

Comparative Examples 13 and 14

Photoelectric conversion devices were prepared by the same process as in Example 19, except that before the deposition of the light absorbing layer 3, the high-temperature heating in the Se atmosphere was not performed or the temperature of the heating in the Se atmosphere was 300° C. The calculation of the area ratio between the crystal and amorphous phases of the intermediate interface layer 2b and the evaluation of the adhesion by the cross-cut test were then performed as in Example 1.

Comparative Examples 15 and 16

Photoelectric conversion devices were prepared by the same process as in Example 22, except that before the deposition of the light absorbing layer 3, the high-temperature heating in the Se atmosphere was not performed or the temperature of the heating in the Se atmosphere was 300° C. The calculation of the area ratio between the crystal and amorphous phases of the intermediate interface layer 2b and the evaluation of the adhesion by the cross-cut test were then performed as in Example 1.

Comparative Examples 17 and 18

Photoelectric conversion devices were prepared by the same process as in Example 25, except that before the deposition of the light absorbing layer 3, the high-temperature heating in the Se atmosphere was not performed or the temperature of the heating in the Se atmosphere was 300° C. The calculation of the area ratio between the crystal and amorphous phases of the intermediate interface layer 2b and the evaluation of the adhesion by the cross-cut test were then performed as in Example 1.

Comparative Examples 19 and 20

Photoelectric conversion devices were prepared by the same process as in Example 28, except that before the deposition of the light absorbing layer 3, the high-temperature heating in the Se atmosphere was not performed or the temperature of the heating in the Se atmosphere was 300° C. The calculation of the area ratio between the crystal and amorphous phases of the intermediate interface layer 2b and the evaluation of the adhesion by the cross-cut test were then performed as in Example 1.

TABLE 1A

| | Light absorbing layer 3 | Electrode layer 2a | Annealing temperature (° C.) |
|---|---|---|---|
| Example 1 | CIGS | Mo | 600 |
| Example 2 | CIGS | Mo | 550 |
| Example 3 | CIGS | Mo | 500 |
| Example 4 | CIGSS | Mo | 600 |
| Example 5 | CIGSS | Mo | 550 |
| Example 6 | CIGSS | Mo | 500 |
| Example 7 | CGS | S/I/S | 600 |
| Example 8 | CGS | S/I/S | 550 |
| Example 9 | CGS | S/I/S | 500 |
| Example 10 | CGS | T/S/I/S | 600 |
| Example 11 | CGS | T/S/I/S | 550 |
| Example 12 | CGS | T/S/I/S | 500 |
| Example 13 | AGS | S/I/S | 600 |
| Example 14 | AGS | S/I/S | 550 |
| Example 15 | AGS | S/I/S | 500 |
| Example 16 | AGS | T/S/I/S | 600 |
| Example 17 | AGS | T/S/I/S | 550 |
| Example 18 | AGS | T/S/I/S | 500 |
| Example 19 | CGSS | S/I/S | 600 |
| Example 20 | CGSS | S/I/S | 550 |
| Example 21 | CGSS | S/I/S | 500 |
| Example 22 | CGSS | T/S/I/S | 600 |
| Example 23 | CGSS | T/S/I/S | 550 |
| Example 24 | CGSS | T/S/I/S | 500 |
| Example 25 | AGSS | S/I/S | 600 |

TABLE 1B

| | Sc/(Sa + Sc) | Adhesion rate |
|---|---|---|
| Example 1 | 0.45 | A |
| Example 2 | 0.55 | A |
| Example 3 | 0.90 | A |
| Example 4 | 0.44 | A |
| Example 5 | 0.55 | A |
| Example 6 | 0.89 | A |
| Example 7 | 0.42 | A |
| Example 8 | 0.52 | A |
| Example 9 | 0.87 | A |
| Example 10 | 0.42 | A |
| Example 11 | 0.52 | A |
| Example 12 | 0.86 | A |
| Example 13 | 0.43 | A |
| Example 14 | 0.53 | A |
| Example 15 | 0.88 | A |
| Example 16 | 0.43 | A |
| Example 17 | 0.52 | A |
| Example 18 | 0.87 | A |
| Example 19 | 0.41 | A |
| Example 20 | 0.52 | A |
| Example 21 | 0.86 | A |
| Example 22 | 0.42 | A |
| Example 23 | 0.51 | A |
| Example 24 | 0.87 | A |
| Example 25 | 0.40 | A |

TABLE 2A

| | Light absorbing layer 3 | Electrode layer 2a | Annealing temperature (° C.) |
|---|---|---|---|
| Example 26 | AGSS | S/I/S | 550 |
| Example 27 | AGSS | S/I/S | 500 |
| Example 28 | AGSS | T/S/I/S | 600 |
| Example 29 | AGSS | T/S/I/S | 550 |
| Example 30 | AGSS | T/S/I/S | 500 |
| Comparative Example 1 | CIGS | Mo | W.T. |
| Comparative Example 2 | CIGS | Mo | 300 |
| Comparative Example 3 | CIGSS | Mo | W.T. |
| Comparative Example 4 | CIGSS | Mo | 300 |
| Comparative Example 5 | CGS | S/I/S | W.T. |
| Comparative Example 6 | CGS | S/I/S | 300 |
| Comparative Example 7 | CGS | T/S/I/S | W.T. |
| Comparative Example 8 | CGS | T/S/I/S | 300 |
| Comparative Example 9 | AGS | S/I/S | W.T. |
| Comparative Example 10 | AGS | S/I/S | 300 |
| Comparative Example 11 | AGS | T/S/I/S | W.T. |
| Comparative Example 12 | AGS | T/S/I/S | 300 |
| Comparative Example 13 | CGSS | S/I/S | W.T. |
| Comparative Example 14 | CGSS | S/I/S | 300 |
| Comparative Example 15 | CGSS | T/S/I/S | W.T. |
| Comparative Example 16 | CGSS | T/S/I/S | 300 |
| Comparative Example 17 | AGSS | S/I/S | W.T. |
| Comparative Example 18 | AGSS | S/I/S | 300 |
| Comparative Example 19 | AGSS | T/S/I/S | W.T. |
| Comparative Example 20 | AGSS | T/S/I/S | 300 |

W.T.: Without Treatment

TABLE 2B

|  | Sc/(Sa + Sc) | Adhesion rate |
|---|---|---|
| Example 26 | 0.51 | A |
| Example 27 | 0.85 | A |
| Example 28 | 0.41 | A |
| Example 29 | 0.50 | A |
| Example 30 | 0.86 | A |
| Comparative Example 1 | 0.98 | C |
| Comparative Example 2 | 0.96 | C |
| Comparative Example 3 | 0.98 | C |
| Comparative Example 4 | 0.96 | C |
| Comparative Example 5 | 0.94 | B |
| Comparative Example 6 | 0.92 | B |
| Comparative Example 7 | 0.94 | B |
| Comparative Example 8 | 0.92 | B |
| Comparative Example 9 | 0.94 | B |
| Comparative Example 10 | 0.92 | B |
| Comparative Example 11 | 0.94 | B |
| Comparative Example 12 | 0.92 | B |
| Comparative Example 13 | 0.94 | B |
| Comparative Example 14 | 0.92 | B |
| Comparative Example 15 | 0.94 | B |
| Comparative Example 16 | 0.92 | B |
| Comparative Example 17 | 0.94 | B |
| Comparative Example 18 | 0.92 | B |
| Comparative Example 19 | 0.94 | B |
| Comparative Example 20 | 0.92 | B |

When a transparent electrode was used to form the electrode layer 2a, the strength of the adhesion was not enough although it was higher than that in the case where oriented Mo crystals were used. When Mo was used to form the electrode layer 2a or when an extremely thin Mo film was deposited on a transparent electrode as the electrode layer 2a, the intermediate interface layer 2b was formed by heating the Mo or the extremely thin Mo film in a Se atmosphere, and the formed intermediate interface layer 2b had a structure in which randomly-oriented $MoSe_2$ crystallites were covered with a $MoSe_2$ amorphous phase. The formation of the intermediate interface layer 2b significantly improved the peeling resistance regardless of the area ratio.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photoelectric conversion device comprising:
a substrate;
a bottom electrode comprising an electrode layer on the substrate and an intermediate interface layer; and
a light absorbing layer on the intermediate interface layer,
wherein the electrode layer comprises Mo or W,
the intermediate interface layer is a compound thin film of a compound comprising Mo or W and at least one element X selected from the group consisting of S, Se, and Te,
the intermediate interface layer has a crystal phase and an amorphous phase with which at least part of the crystal phase is covered, and
the intermediate interface layer satisfies the relation 0.4≤area ratio Sc/(Sa+Sc)≤0.9, wherein Sc is the area of the crystal phase, and Sa is the area of the amorphous phase.

2. The device according to claim 1, wherein the electrode layer comprises Mo as a constituent element.

3. The device according to claim 1, wherein the crystal phase comprises randomly oriented crystals.

4. The device according to claim 1, wherein the light absorbing layer includes a p-type compound semiconductor layer and n-type compound semiconductor layer.

5. The device according to claim 4, wherein the p-type compound semiconductor layer contains at least the element X.

6. The device according to claim 4, wherein the p-type compound semiconductor layer has one of a chalcopyrite structure, a stannite structure, and a kesterite structure.

7. The device according to claim 1, wherein crystals with c axes oriented in the same direction in the crystal phase make up 10% or less of crystals in the intermediate interface layer.

8. The device according to claim 1, wherein 80% or more of the crystal phase in the intermediate interface layer is covered with the amorphous phase.

9. A solar cell comprising a photoelectric conversion device, the photoelectric conversion device comprising at least:
a substrate;
a bottom electrode comprising an electrode layer on the substrate and an intermediate interface layer; and
a light absorbing layer formed on the intermediate interface layer,
wherein the electrode layer comprises Mo or W,
the intermediate interface layer is a compound thin film of a compound comprising Mo or W and at least one element X selected from the group consisting of S, Se, and Te,
the intermediate interface layer has a crystal phase and an amorphous phase with which at least part of the crystal phase is covered, and
the intermediate interface layer satisfies the relation 0.4≤area ratio Sc/(Sa+Sc)≤0.9, wherein Sc is the area of the crystal phase, and Sa is the area of the amorphous phase.

10. The cell according to claim 9, wherein the electrode layer comprises Mo as a constituent element.

11. The cell according to claim 9, wherein the crystal phase comprises randomly oriented crystals.

12. The cell according to claim 9, wherein the light absorbing layer includes a p-type compound semiconductor layer and a n-type compound semiconductor layer.

13. The cell according to claim 12, wherein the p-type compound semiconductor layer contains at least the element X.

14. The cell according to claim 12, wherein the p-type compound semiconductor layer has one of a chalcopyrite structure, a stannite structure, and a kesterite structure.

15. The cell according to claim 9, wherein crystals with c axes oriented in the same direction in the crystal phase make up 10% or less of crystals in the intermediate interface layer.

16. The cell according to claim 9, wherein 80% or more of the crystal phase in the intermediate interface layer is covered with the amorphous phase.

* * * * *